United States Patent
Zdenek

Patent Number: 5,822,265
Date of Patent: Oct. 13, 1998

[54] DRAM CONTROLLER WITH BACKGROUND REFRESH

[75] Inventor: Jerrold Scott Zdenek, Riverside, Ill.

[73] Assignee: Rockwell Semiconductor Systems, Inc., Newport Beach, Calif.

[21] Appl. No.: 901,889

[22] Filed: Jul. 29, 1997

[51] Int. Cl.⁶ .................................................. G11C 7/00
[52] U.S. Cl. .......................................... 365/222; 365/227
[58] Field of Search ................................... 365/222, 227, 365/189.01

[56] References Cited

U.S. PATENT DOCUMENTS

| | | | |
|---|---|---|---|
| 5,321,661 | 6/1994 | Iwakiri et al. | 365/222 |
| 5,418,920 | 5/1995 | Kuddes | 395/425 |
| 5,495,452 | 2/1996 | Cha | 365/222 |
| 5,617,551 | 4/1997 | Corder | 395/401 |
| 5,619,468 | 4/1997 | Ghosh et al. | 365/222 |
| 5,682,498 | 10/1997 | Harness | 395/433 |
| 5,684,751 | 11/1997 | Manning | 365/222 |

OTHER PUBLICATIONS

*Circuit Description—H6–41E030–A, ECM 11, 91–E03000–A, Enhanced Common Memory II Card* Rockwell Switching Systems Division, Rockwell International—Internal Publication, Mar. 11, 1996 (2 pages).

*Circuit Description—Bus Maintenance Unity (BMU)—* Rockwell Switching Systems Division, Rockwell International—Internal Publication, Sep. 2, 1992 (2 pages).

*Circuit Description—Peripheral Data Interface (PDI) Card*—Rockwell Switching Systems Division, Rockwell Internaitonal—Internal Publication, Jul. 31, 1992 (2 pages).

*Primary Examiner*—David C. Nelms
*Assistant Examiner*—Hien Nguyen
*Attorney, Agent, or Firm*—Welsh & Katz, Ltd.

[57] ABSTRACT

A DRAM controller refreshers a DRAM having a maximum refresh interval. The DRAM controller measures a time interval after a refresh cycle, monitors a memory request input of the DRAM for an idle period after a measured time interval of substantially less than the maximum refresh interval, and refreshes the DRAM with a refresh cycle upon detecting one of an idle period and a measured time interval of the maximum refresh interval.

14 Claims, 1 Drawing Sheet

DRAM CONTROLLER WITH BACKGROUND REFRESH

BACKGROUND OF THE INVENTION

This invention relates generally to dynamic random access memory controllers and more particularly to a novel dynamic random access memory controller with a variable refresh cycle.

Memory devices are used on various types of electronic equipment, including general purpose computers, such as "personal computers," as well as special purpose computers, such as electronic switches for telephone systems. One type of a memory device is a dynamic random access memory device ("DRAM"). Typically, electronic devices use DRAM to store information for retrieval at a later time. A memory element of a DRAM can maintain information for only a short period of time, typically less than a thousandth of a second. Accordingly, a DRAM must be periodically "refreshed" to maintain information over longer periods of time. Such refreshes are typically performed at fixed intervals of time. During such a refresh operation ("refresh cycle"), the DRAM is not available for information storage or retrieval operations ("write cycle" and "read cycle," respectively). Thus, periodic refresh cycles occurring at fixed intervals may be detrimental to system performance, such as when the fixed interval refresh cycles interfere with write cycles or read cycles.

SUMMARY OF THE INVENTION

The present invention avoids degradation of performance which may be caused by imposing fixed interval refresh cycles on a DRAM. According to one embodiment, with respect to a DRAM having a maximum refresh interval, a DRAM controller performs a background refresh cycle by measuring a time interval after a refresh cycle, monitoring a memory request input of the DRAM for an idle period after a measured time interval substantially less than the maximum refresh interval., and refreshing the DRAM with a refresh cycle upon detecting one of an idle period and a measured time interval of the maximum refresh interval.

DETAILED DESCRIPTION

Figure 1:
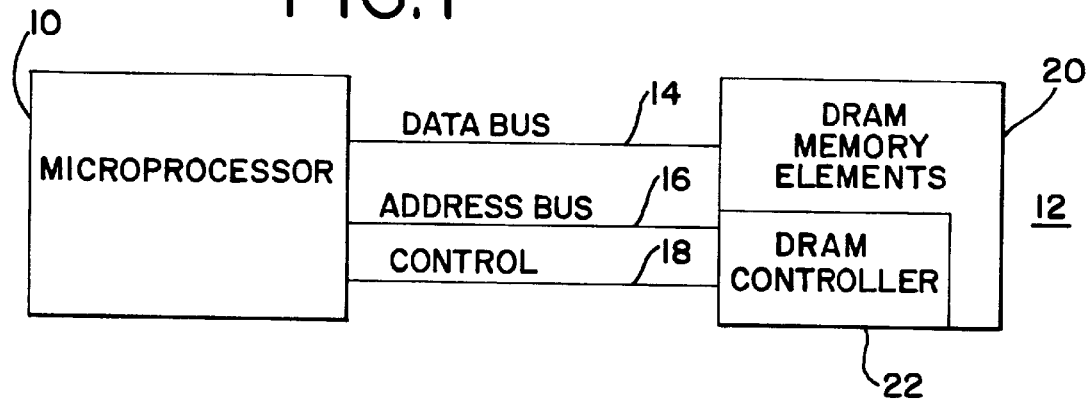
FIG. 1 is a block diagram of an example of a microprocessor connected to a DRAM controller of the present invention.

FIG. 1 shows an example of a microprocessor and memory configuration. A microprocessor 10 is connected to a DRAM 12 by a data bus 14, and an address bus 16. The data bus 14 may comprise a single connection, or, alternatively, a plurality of parallel connections. Typically, the address bus 16 comprises a plurality of parallel address connections and an address control line 18. It should be noted that "parallel," with respect to the data and address busses, is used in the logical sense (e.g., an 8 bit wide parallel bus) and does not necessarily require the electrical connections to be physically parallel to each other. Typically, the data bus 14 is connected to the memory elements 20 of the DRAM 12 while the address bus 16 and the control line 18 are connected to a DRAM controller 22.

Figure 2:
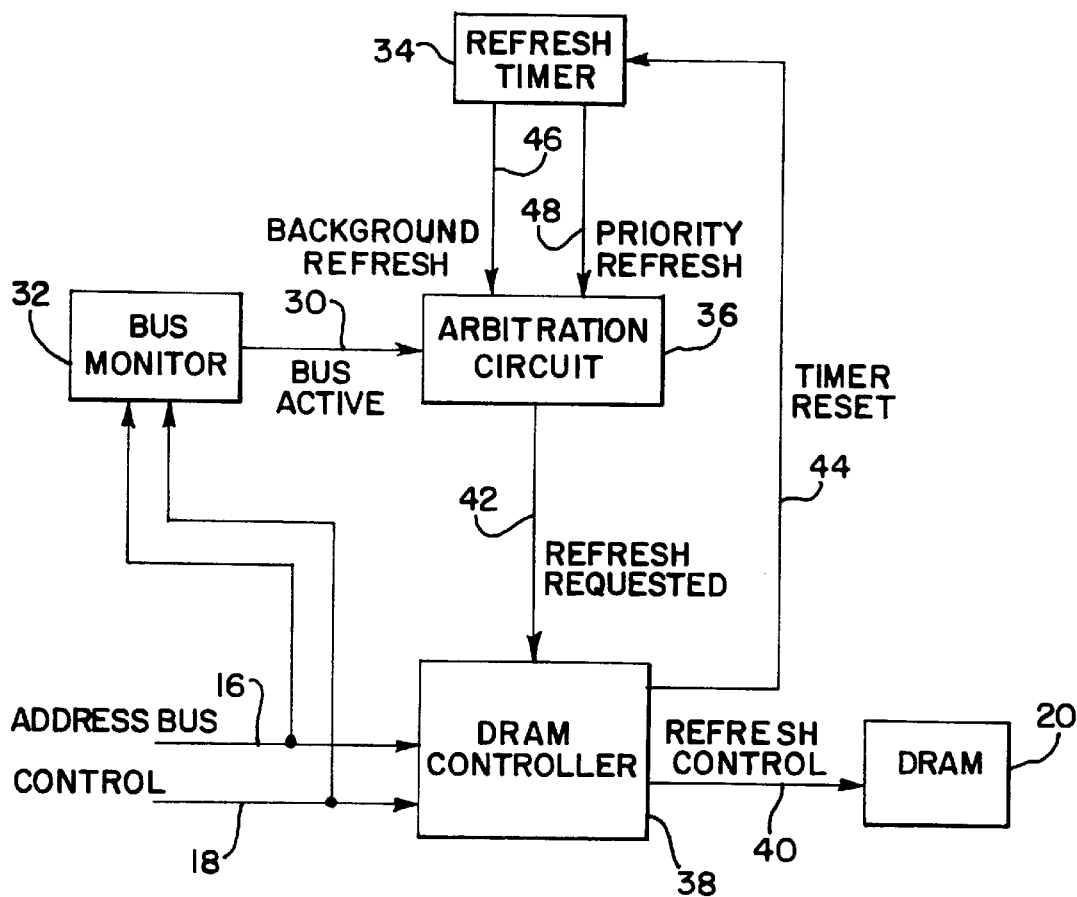
FIG. 2 is a block diagram of one embodiment of a DRAM controller and refresh timer according to the present invention.

FIG. 2 illustrates memory elements 20 and a portion of the control elements for the DRAM controller 22, including an embodiment of the present invention. The control elements include a bus monitor 32, a refresh timer 34, an arbitration circuit 36, and a refresh controller 38. The refresh controller 38 is connected to the address bus 16 and one or more control lines 18 from the microprocessor. A refresh control line 40 connects the refresh controller 38 to the memory elements 20.

The memory elements 20 are typically refreshed periodically to maintain information stored in the memory elements. In one embodiment, the maximum refresh time interval for the DRAM is 15.3 microseconds ($\mu$s). However, alternative DRAMs may have differing maximum refresh time intervals.

In one approach, the DRAM is refreshed when the refresh controller 38 temporarily sets the refresh control line 40 to an active state. The term "refresh strobe" refers to temporarily setting the refresh control line 40 to the active state. The active state may be a logical "high" or "low" signal. The refresh controller 38 is connected to the arbitration circuit 36 via a refresh requested control line 42. The refresh controller 38 issues a refresh strobe on the refresh control line 40 when the refresh requested control line 42 is set to its active state.

In the illustrated embodiment, the refresh timer 34 is connected to the refresh controller 38. The refresh timer 34 is reset when the refresh controller 38 refreshes the memory elements. The reset of the refresh timer 34 may be accomplished with an individual timer reset line 44, as shown in FIG. 2, or, alternatively, with the refresh strobe. The refresh timer 34 includes two outputs, a background refresh control line 46 and a priority refresh control line 48. The refresh timer may be implemented in hardware or software. A hardware timer may include a counter circuit that counts clock pulses of a predetermined period. Alternatively, an R-C discharge circuit may be used.

When the refresh timer 34 is reset, both outputs are set to their respective inactive status. The refresh timer 34 sets the background refresh control line 46 to its active state after a predetermined interval of time has elapsed which is substantially less than the maximum refresh time interval. In one embodiment, the refresh timer 34 sets the background refresh control line 46 to its active state after an interval of time equal to approximately one-half the maximum refresh time interval has elapsed, which is approximately 8 $\mu$s. The refresh timer 34 sets the priority refresh control line 48 to its active state after a second predetermined interval of time has elapsed, which is longer than the first predetermined interval of time, but not longer than the maximum refresh time interval. In one embodiment, three fourths of the maximum refresh time interval is selected as the second predetermined time interval. In the illustrated embodiment, the refresh timer 34 sets the priority refresh control line 48 to its active state after approximately 12 $\mu$s has elapsed since the last refresh cycle.

In the illustrated embodiment, the bus monitor 32 is connected to the address bus 16, including the address control line 18. In the embodiment shown, the bus monitor 32 monitors the activity of the address control line 18 for an address strobe. The term "address strobe" refers to temporarily setting the address control line 18 to its active state. An address strobe occurs when the microprocessor 10 issues a memory request, such as a read cycle or a write cycle, to a particular DRAM 12. Alternatively, the bus monitor 32 may also monitor the address bus 16 or the data bus 14 for valid addresses or data respectively. A comparitor may be used to determine whether valid addresses or data are present. Activity on the address control line 18 indicates that the microprocessor is executing a read cycle or a write cycle on the memory elements. A lack of activity on the address bus indicates that the DRAM 12 is in an idle period. A lack of activity includes cycles when there is no valid address, or if a valid address is present, the address is outside a range of addresses serviced by the DRAM 12. In this alternative embodiment, the bus monitor 32 sets a bus active control line 50 to its active state when the bus monitor 32 detects a lack of activity on the address bus 16 and/or address control line 18.

A lack of activity on the address bus 16 and/or address control line 18 may be referred to as an "idle period." An idle period does not necessarily indicate that the processor 10 is idle, but rather indicates that a particular DRAM 12 is not being accessed by the processor 10. For example, the processor 10 may be accessing additional DRAM. However, the processor 10 may also be accessing other memory elements, such as SRAM or ROM, or various input/output ports or peripheral devices. Thus, while an idle period may be expected to have a duration approximately equal to a read or write cycle for a DRAM, any given idle period may be shorter or longer than a DRAM read or write cycle.

In the illustrated embodiment, the arbitration circuit 36 is connected to the bus active control line 50, the background refresh control line 46, and priority refresh control line 48. In one embodiment, the arbitration circuit 36 sets the refresh requested control line 42 to its active state when the background refresh control line 46 and the bus activity control line 50 are set to their respective active states. The arbitration circuit 36 also sets the refresh requested control line 42 to its active state when the priority refresh control line 48 is in its active state, regardless of the states of the bus activity control line 50 or the background refresh control line 46. Known logic gates, such as an AND gate and an OR gate, may comprise the arbitration circuit.

In operation of the illustrated embodiment, the refresh timer 34 is reset when the refresh controller 38 refreshes the memory elements. Immediately after a refresh timer 34 is reset, both the background refresh control line 46 and priority refresh control line 48 are set to their respective inactive states. In one embodiment, after about one-half of the maximum refresh time interval of the DRAM has elapsed, the reset timer 34 sets the background refresh control line 46 active. However, various time intervals less than the maximum refresh time interval are contemplated.

In the illustrated embodiment, when the background refresh control line 46 is active, a refresh may be requested by the arbitration circuit 36 depending on the activity of the address bus 16. Should the bus monitor 32 detect an idle period where the address bus 16 is inactive, thereby setting the bus activity control line 50 to its active state, during a time when the background refresh control line 46 is active, the arbitration circuit 36 will set the refresh requested control line 42 active and the refresh controller 38 will generate a refresh strobe to refresh the memory elements 20 and reset the refresh timer 34. Ideally, the entire refresh cycle will be completed prior to the end of the idle period. When a background refresh is thus performed, system performance may be enhanced because the refresh cycle occurred during an idle period for the DRAM 12 and did not interfere with an attempt by the microprocessor 10 to execute a read cycle or a write cycle.

It should be noted that executing such a background refresh does not absolutely guarantee that the processor 10 will not attempt to access the DRAM 12 during a refresh cycle. The likelihood exists that the processor 10 will eventually attempt to execute a memory access during a refresh cycle. In that event, the processor 10 has to wait until the end of the refresh cycle. However, one may adjust the periods for the refresh timer 34, depending on the processor, DRAM, and clock speeds selected, to minimize the possibility of a conflict. Performance may be substantially improved by minimizing conflicts between the processor 10 and the refresh cycle in this way, even if the potential for conflict is not completely eliminated.

Should the address bus 16 remain active, thereby inhibiting a background refresh as described above, the bus timer 34 will set the priority refresh control line 48 to its active state after most (in one example, approximately three fourths) of the maximum refresh time interval has elapsed. When the priority refresh control line 48 is active, the arbitration circuit 36 sets the refresh requested control line 42 active regardless of whether there is any address bus 16 activity. The refresh controller 38 then refreshes the memory elements of the DRAM 20 and resets the refresh timer 34. While a refresh cycle initiated pursuant to a priority refresh may interfere with microprocessor 10 access to the memory elements 20, a priority refresh is preferable to loss of information in the memory elements of the DRAM 20.

The foregoing description is given for clarity of understanding of the invention. It is to be understood that various changes can be made by one skilled in the art to the above described DRAM controller without departing from the scope or spirit of the invention.

What is claimed is:

1. A method of refreshing a set of memory elements within a dynamic random access memory with a refresh cycle before expiration of a maximum refresh interval, such method comprising the steps of:

measuring a first time interval after a refresh cycle, the first time interval being substantially shorter than the maximum refresh interval;

measuring a second time interval after a refresh cycle, the second time interval being longer than the first time interval and not longer than the maximum refresh interval;

monitoring accesses to the dynamic random access memory for an idle period; and refreshing the set of memory elements with a refresh cycle upon detecting one of an idle period after the elapse of the first time interval and the elapse of the second time interval.

2. The method as in claim 1, wherein the step of monitoring accesses to the dynamic random access memory further comprises the step of detecting an address strobe on an address control input of the dynamic random access memory from a controlling processor.

3. The method as in claim 1, wherein the step of monitoring a memory request input further comprises the step of detecting a valid address on an address input of the dynamic random access memory from a controlling processor.

4. The method as in claim 1, wherein the step of measuring a time interval after a refresh cycle further comprises the step of resetting a timer after a refresh cycle.

5. The method of claim 1, wherein the first time interval is about one half of the maximum refresh interval and wherein the second time interval is about three quarters of the maximum refresh interval.

6. An apparatus for refreshing a set of memory elements within a dynamic random access memory with a refresh cycle before expiration of a maximum refresh interval, such apparatus comprising:

means for measuring first and second time intervals after a refresh cycle, the first time interval being substantially shorter than the maximum refresh interval and the second time interval being longer than the first time interval and not longer than the maximum refresh interval;

means for monitoring accesses to the set of memory elements for an idle period;

means for requesting a refresh cycle upon detecting one of an idle period after elapse of the first time interval and elapse of the second time interval; and means for refreshing the set of memory elements with a refresh cycle in response to a request for a refresh cycle.

7. The apparatus as in claim 6, wherein the means for monitoring accesses to the set of memory elements comprises means for detecting an address strobe on an address strobe input of the dynamic random access memory from a controlling processor.

8. The apparatus as in claim 6, wherein the means for monitoring accesses to the set of memory elements further comprises means for detecting a valid address on an address input of the dynamic random access memory from a controlling processor.

9. The apparatus as in claim 6, wherein the means for measuring first and second time intervals after a refresh cycle further comprises means for resetting a timer after a refresh cycle.

10. The apparatus of claim 6, wherein the first time interval is about one half the maximum refresh interval and the second time interval is about three quarters the maximum refresh interval.

11. An apparatus for refreshing a set of memory elements within a dynamic random access memory with a refresh cycle before expiration of a maximum refresh interval, such apparatus comprising:

a timer having a background refresh output and a priority refresh output;

a bus monitor, connected to a bus providing access to the memory elements;

an arbitration circuit, connected to the timer and to the bus monitor; and a controller, connected to the arbitration circuit, the memory elements, and the timer.

12. The apparatus of claim 11, wherein the timer sets the background refresh output to an active state after a first interval of time substantially less than the maximum refresh interval and the timer sets the priority refresh output to an active state after a second interval of time linger than the first interval and not longer than the maximum refresh interval.

13. The apparatus of claim 12, wherein the arbitration circuit receives the background refresh output and the priority refresh output of the timer, and has a refresh requested output, the arbitration circuit setting the refresh requested output to the active state when the background refresh output is active and an output of the bus monitor is active, the arbitration circuit further setting the refresh requested output to the active state when the priority refresh output is in an active state.

14. The apparatus of claim 13, wherein the controller receives the refresh requested output, the controller refreshing the memory elements with a refresh cycle and resetting the timer when the refresh requested output is in the active state.

* * * * *